(12) United States Patent
Han et al.

(10) Patent No.: US 6,912,332 B2
(45) Date of Patent: Jun. 28, 2005

(54) PARALLEL OPTICAL INTERCONNECTION MODULE AND METHOD FOR MANUFACTURING THE SAME

(75) Inventors: Sang-Pil Han, Daejon-Shi (KR); Choon Gi Choi, Daejon-Shi (KR); Byeong Cheol Kim, Jeollabuk-Do (KR); Seung Ho Ahn, Daejon-Shi (KR); In Kui Cho, Daejon-Shi (KR); Myung Yung Jeong, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 277 days.

(21) Appl. No.: 10/264,622

(22) Filed: Oct. 4, 2002

(65) Prior Publication Data

US 2004/0005119 A1 Jan. 8, 2004

(30) Foreign Application Priority Data

Jun. 7, 2002 (KR) ......................................... 2002-31973

(51) Int. Cl.[7] ................................................ G02B 6/12
(52) U.S. Cl. .............................. 385/14; 385/88; 385/89; 385/92
(58) Field of Search ............................... 385/14–15, 31, 385/39, 49, 50–52, 88–89, 92, 94, 130; 257/98–99, 432, 443, 466

(56) References Cited

U.S. PATENT DOCUMENTS

| | | | | |
|---|---|---|---|---|
| 5,337,391 A | * | 8/1994 | Lebby | ........................ 385/88 |
| 5,574,814 A | | 11/1996 | Noddings et al. | |
| 5,631,988 A | | 5/1997 | Swirhun et al. | |
| 5,675,684 A | * | 10/1997 | Hirataka et al. | .............. 385/88 |
| 5,780,875 A | * | 7/1998 | Tsuji et al. | .................... 257/81 |
| 5,991,487 A | * | 11/1999 | Sugiyama | ................... 385/129 |
| 5,999,675 A | * | 12/1999 | Sugiyama | .................... 385/49 |
| 6,071,016 A | * | 6/2000 | Ichino et al. | ................. 385/92 |
| 6,233,383 B1 | * | 5/2001 | Artigue et al. | ................ 385/39 |
| 6,404,960 B1 | * | 6/2002 | Hibbs-Brenner et al. | ..... 385/52 |
| 6,737,718 B2 | * | 5/2004 | Takeuchi | .................... 257/431 |
| 2002/0185702 A1 | * | 12/2002 | Shirai et al. | ............... 257/443 |
| 2002/0195611 A1 | * | 12/2002 | Yamabayashi et al. | ....... 257/98 |

FOREIGN PATENT DOCUMENTS

| | | |
|---|---|---|
| JP | 2000-056181 | 2/2000 |
| JP | 2000-292656 | 10/2000 |
| JP | 2001-051162 | 2/2001 |

OTHER PUBLICATIONS

Electronic Components and Technology Conference, Para-BIT–1: 60–Gb/s–Throughput Parallel Optical Interconnect Module, 6 pages.

(Continued)

*Primary Examiner*—Diane I. Lee
(74) *Attorney, Agent, or Firm*—Blakely Sokoloff Taylor & Zafman (57) ABSTRACT

The present invention relates to a parallel optical interconnection module for transmitting an optical signal over an optical fiber and receiving an optical signal from the optical fiber. According to the present invention, a reflection surface is formed at the end of the optical waveguide forming a core so that the path of light can be exactly changed and is focused. A light source/photodetector is buried within a trench using the silicon optical bench and an optical waveguide is manually aligned on the surface of the silicon optical bench, so that alignment error between the light source/photodetector and the optical waveguide can be minimized. A ferrule into which the optical waveguide is inserted is fixed to an adaptor so that alignment error between the optical waveguide and the light source/photodetector is minimized. Therefore, the present invention can minimize the coupling loss in the process during which the optical signal is transmitted to increase the optical output. Further, the present invention allows easy optical interconnection by means of a manual alignment and can increase the productivity.

12 Claims, 10 Drawing Sheets

OTHER PUBLICATIONS

Electronic Components and Technology Conference, Module Packaging for High–Speed Serial and Parallel Transmission, 8 pages.

IEEE Journal of Selected Topics in Quantum Electronics, vol. 5, No. 5, Sep./Oct. 1999, pp. 1237–1242.

IEEE Journal of Selectred Topics in Quantum Electronics, vol. 5, No. 2, Mar./Apr. 1999, pp. 184–192.

* cited by examiner

PARALLEL OPTICAL INTERCONNECTION MODULE AND METHOD FOR MANUFACTURING THE SAME

BACKGROUND OF THE INVENTION

1. Field of the Invention

The invention relates generally to a parallel optical interconnection module for transmitting an optical signal over an optical fiber and receiving an optical signal from the optical fiber, and method of manufacturing the same. More particularly, the present invention relates to a parallel optical interconnect optical transmit/receive module comprising an optical waveguide having a lens type reflection surface for reducing the coupling loss generated due to alignment error when it is coupled with an optical fiber, a silicon optical bench for reducing the coupling loss generated due to alignment error when it is coupled with the optical fiber, and a ferrule by which fixture to the optical waveguide for optical interconnection is facilitated.

2. Description of the Prior Art

Generally, in a low-speed system, or the like, interconnection between a circuit substrate and a circuit substrate, and a chip and a chip or a system is made through an electrical metal cable. However, as information becomes large-scaled and the transfer speed becomes rapid in a next-generation information communication system consisting of a large-capacity parallel computer, an ATM switching system of over 1 Tb/s, and the like, electrical problems such as skew, EMI (electromagnetic interference), etc, are caused if this metal cable is employed. Due to this, the operation efficiency of the system is lowered and the integration of the system is made difficult.

Therefore, there has recently been developed a technology of optical interconnection using an optical transmit/receive module. An optical interconnecting method within the optical transmit/receive module includes: a method of directly interconnecting an optical receive device to a ribbon optical fiber multi-channel optical connector having a reflection mirror located at an angle of inclination of 45°, a method of interconnecting a polymer optical waveguide having a reflection mirror located at an angle of inclination of 45° to an optical transmit/receive device and interconnecting the polymer optical waveguide to the multi-channel optical connector, a method of vertically interconnecting the optical transmit/receive device to the polymer optical waveguide and interconnecting the polymer optical waveguide to the multi-channel optical connector, a method of vertically interconnecting the optical transmit/receive device fixed to a plastic package to the multi-channel optical connector, and the like. At this time, a vertical cavity surface emitting laser (VCSEL) array is usually used as the optical transmit device, which is the light source. In other words, the photodetector includes a photo diode (PD) array.

Korean Patent Application No. 2000-7003642 (filed on Apr. 4, 2000) entitled 'Optical Module' discloses an optical module in which light oscillated through an outgoing unit is reflected by the optical waveguide by 90° and the light is then transmitted to an optical fiber connected to an optical connector along a core formed at the substrate.

'ParaBIT-1: 60-Gb/s-Throughput Parallel Optical Interconnect Module by N. Usui' (May, 2000, ECTC 2000) discloses a module having a structure in which a 24-channel waveguide film with a plan reflection mirror is located by an angle of inclination of 45° and a 24-optical fiber BF connector are connected, and in which the waveguide film and the connector are manually assembled.

Of these prior arts, it is the method of interconnecting the optical transmit/receive device to the polymer optical waveguide having a reflection mirror located at an angle of inclination of 45° and interconnecting the polymer optical waveguide to the multi-channel optical connector, is the most effective method. The reason is that the reflection mirror can be easily formed and the function of the entire module can be extended since an optical coupler, WDM (wavelength division multiplexing) device, etc. can be built in the polymer optical waveguide.

However, a large coupling loss is generated even though a slight alignment error is caused when the optical transmit/receive device and the optical fiber are coupled if the above optical interconnection technology is employed in the future in order to manufacture a parallel optical interconnect optical transmit/receive module having an extended function. Therefore, there is a need for a parallel optical interconnect optical transmit/receive module capable of minimizing the coupling loss.

SUMMARY OF THE INVENTION

The present invention is contrived to solve the above problems and an object of the present invention is to provide a parallel optical interconnection module capable of minimizing the coupling loss in the process in which an optical signal is transmitted and thus increasing the optical output.

In order to accomplish the above object, a reflection surface is formed at an end of a core forming an optical waveguide in order to exactly change the path of light and concentrate the light. A ferrule into which the optical waveguide is inserted is fixed to an adaptor in order to minimize alignment error between the optical waveguide and a light source/a photodetector is minimized. The light source/the photodetector are buried within a trench having a silicon optical bench. Further, the optical waveguide is manually attached on the surface of the silicon optical bench in order to minimize alignment error between the light source/photodetector and the optical waveguide.

Another object of the present invention is to provide a method of manufacturing a parallel optical interconnection module capable of minimizing alignment error between the light source/photodetector and the optical waveguide.

In order to accomplish the above object, a parallel optical interconnection module according to the present invention, is characterized in that it comprises a substrate having a trench at a given region and a heat spreader and in which an electrode pad and given electronic circuit patterns are formed; a silicon optical bench formed on the substrate and having a trench; a light source/photodetector formed within the trench formed at the silicon optical bench and having a light source and a photodetector, wherein the light source generates an optical signal to output the signal toward the outside through an aperture and the photodetector receives the optical signal incident through the aperture from the outside and then converts the optical signal into an electrical signal; a driving unit/receiving unit formed on the substrate and having a driver and a receiver, wherein the drive drives the light source depending on the electrical signal supplied through the electrode pad and the receiver amplifies the electrical signal from the photodetector to output the amplified signal to the electrode pad; an optical waveguide having a core formed between lower and upper clad layers and having a reflection surface formed at the end of the core; an adaptor connected to a connector connected to an optical fiber; and a ferrule for fixing the optical waveguide to the adaptor, wherein the substrate and the adaptor are coupled so that the aperture and the reflection surface are opposite.

In order to accomplish the above object, a method of manufacturing a parallel optical interconnection module according to the present invention, is characterized in that it comprises the steps of preparing an optical waveguide in which a core is formed between lower and upper clad layers and having a reflection surface at the end of the core; forming a silicon nitride film pattern for defining a trench on the silicon optical bench; etching the silicon optical bench using the silicon nitride film pattern as an etch mask to form a trench, wherein the trench is formed by controlling the marginal width and depth of the trench so that the light source/photodetector can be located at a desired location within the trench in a depth direction; removing the silicon nitride film pattern; depositing a base metal layer within the trench and performing annealing; depositing a material for a solder within the trench and then heating the material to reflow the material; inserting/mounting a light source/photodetector so that the light source/photodetector can be self-aligned in horizontal and depth directions within the trench; and exactly aligning an alignment mask formed on the upper clad layer and an alignment mask formed on the silicon optical bench so that the reflection surface and the aperture formed at the light source/photodetector are opposite in order to attach the optical waveguide on the silicon optical bench.

BRIEF DESCRIPTION OF THE DRAWINGS

The aforementioned aspects and other features of the present invention will be explained in the following description, taken in conjunction with the accompanying drawings, wherein:

FIGS. 6A, 6B, and 6C are graphs illustrating a result of comparing the optical coupling efficiency of an optical waveguide of a reflection curvature and an optical waveguide of a 45 reflection plane;

DETAILED DESCRIPTION OF PREFERRED EMBODIMENTS

The present invention will be described in detail by way of a preferred embodiment with reference to accompanying drawings, in which like reference numerals are used to identify the same or similar parts.

Conventionally, a vertical cavity surface emitting laser (VCSEL) that can be available in a short wavelength band of 850 nm is used as a light source. In recent, however, as a vertical cavity surface emitting laser (VCSEL) that can be available in a long wavelength band of 1300 nm and 1550 nm has recently been developed, it is possible to implement a single mode vertical cavity surface emitting laser (VCSEL) optical transmit/receive module of a long wavelength. In addition, as the size of a core of a single mode optical waveguide is significantly made smaller compared to a multi-mode optical waveguide, there is a need for a new technology for optical interconnection and alignment with the vertical cavity surface emitting laser (VCSEL) and the photo diode (PD).

The present invention provides an improved parallel optical interconnect optical transmit/receive module that can be easily interconnected with an optical fiber, and capable of transmitting a large quantity of data at high speed and minimizing the coupling loss.

The parallel optical interconnection module according to the present invention includes a light source/a photodetector for converting an electrical signal into an optical signal or the optical signal into the electrical signal, a driving unit/receiving unit for transferring the electrical signal to the light source or amplifying the converted electrical signal, an optical connector connected to a connector connected to an optical fiber, and an optical coupler for transferring the optical signal transmitted via the optical connector to the photodetector or transmitting the optical signal emitted from the light source to the optical fiber.

Figure 1A:
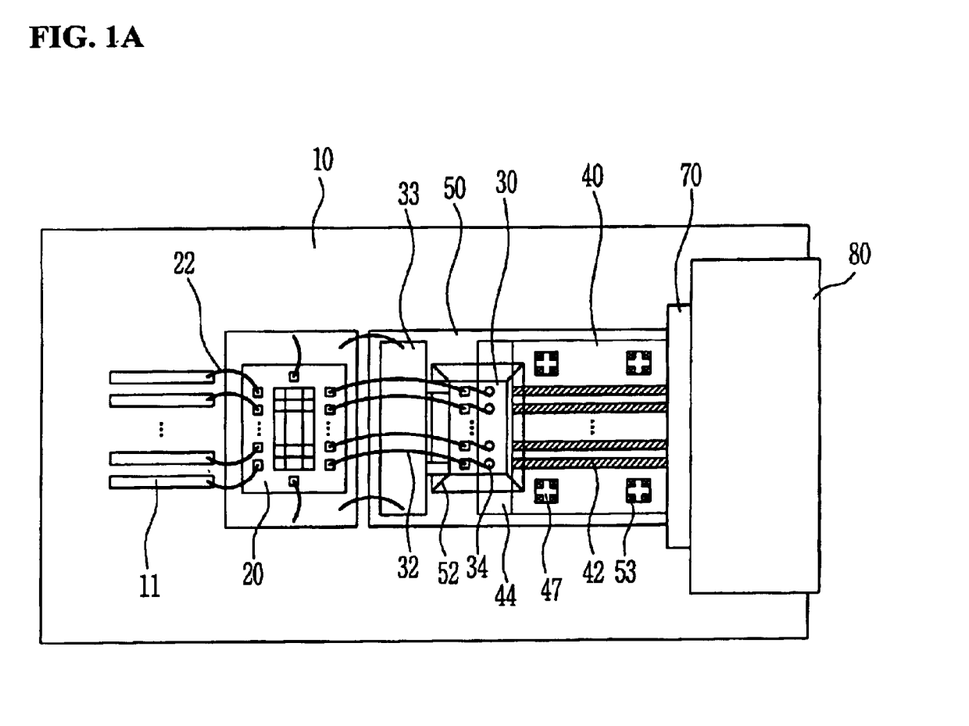
FIG. 1A and FIG. 1B are plan and side view of a parallel optical interconnection module according to a preferred embodiment of the present invention.
Figure 1B:
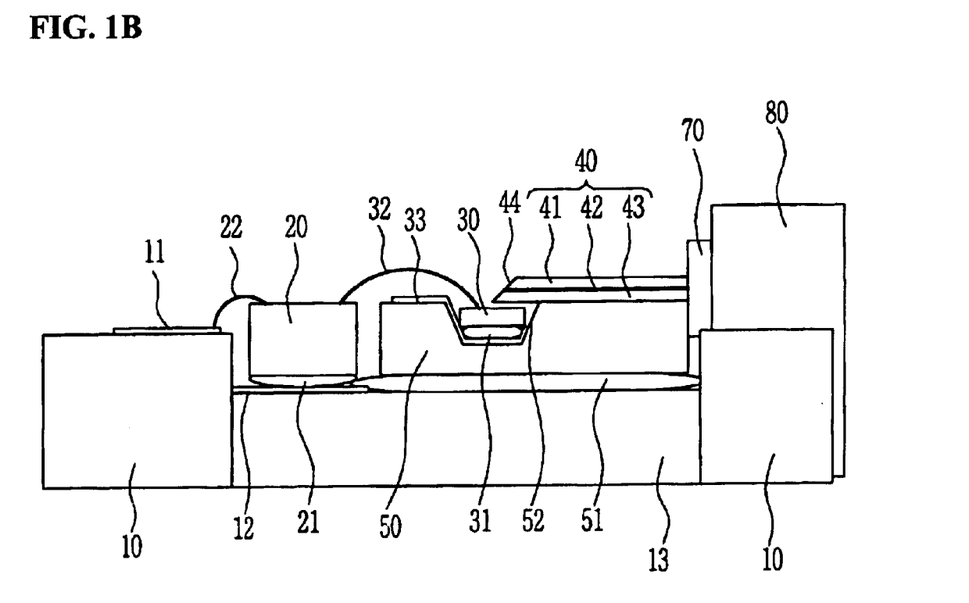
Figure 2:
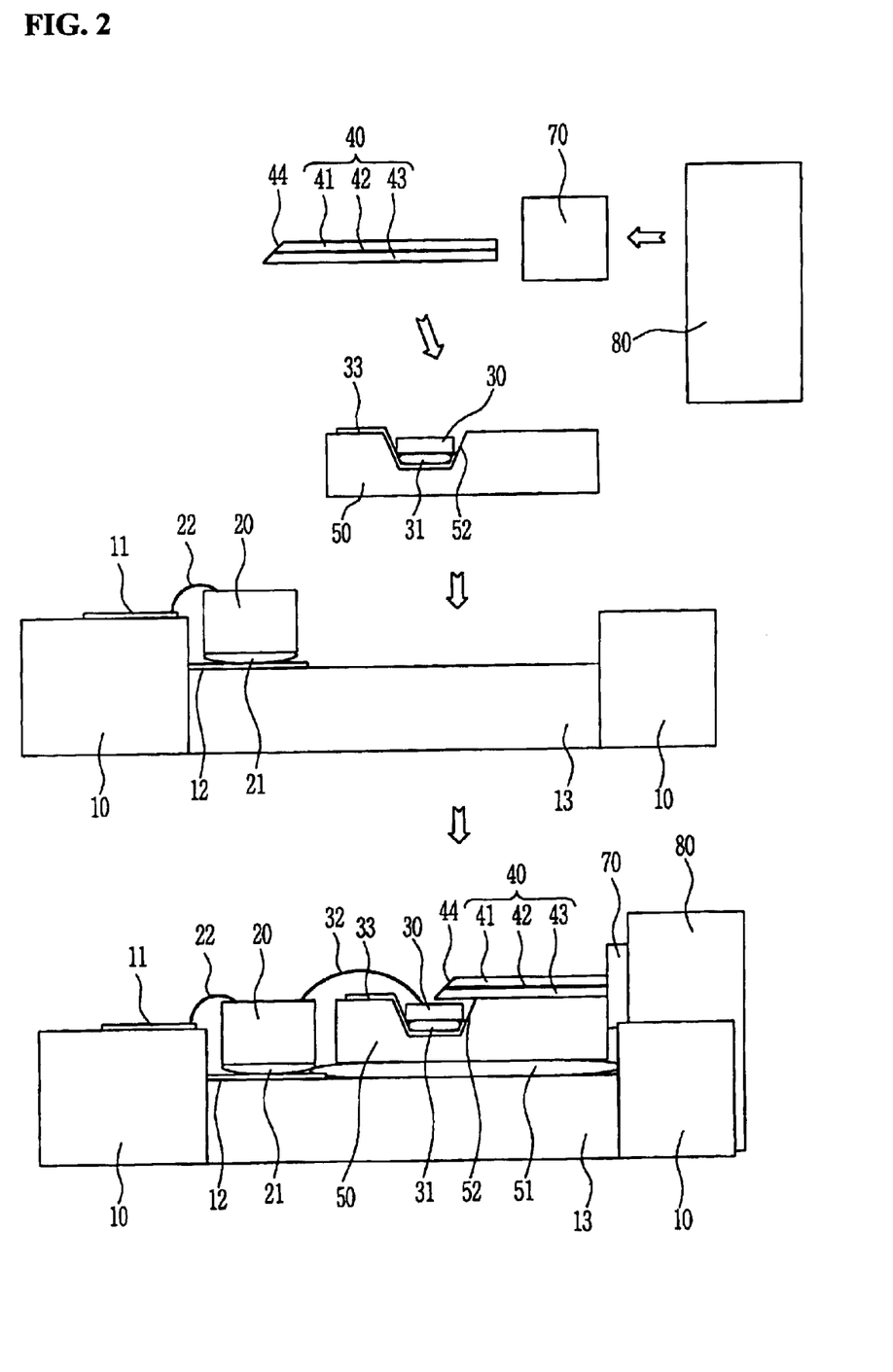
FIG. 2 illustrates a process of packaging the parallel optical interconnection module shown in FIG. 1a and FIG. 1b.

FIG. 1A and FIG. 1B are plan and side view of a parallel optical interconnection module according to a preferred embodiment of the present invention, and FIG. 2 illustrates a process of packaging the parallel optical interconnection module shown in FIG. 1A and FIG. 1B.

Referring now to FIGS. 1A, 1B and 2, the parallel optical interconnection module includes a substrate 10 in which an electrode pad 11 and given electrical and electronic circuits (not shown) are formed, a light source/photodetector 30 included within a trench 52 included in a part of a silicon optical bench 50, a driving unit/receiving unit 20 formed on the substrate 10 for driving the light source 30 depending on an electrical signal supplied through the electrode pad 11 or amplifying the electrical signal supplied from the photodetector 30 to output the amplified signal via the electrode pad 11, an adaptor 80 connected to a connector (not shown) connected to an optical fiber, an optical waveguide 40 having a core 42 formed between lower and upper clad layers 43, 41 and having a reflection surface 44 at the end of the core 42, and a ferrule 70 for fixing the optical waveguide 40 to the adaptor 80. At this time, the substrate 10 and the adaptor 80 are coupled so that an aperture 34 and the reflection surface 44 are facing each other. The silicon optical bench 50 is automatically aligned as the light source/photodetector is buried within trench 52 that is made considering the size of the light source/photodetector 30.

The parallel optical interconnection module according to a preferred embodiment of the present invention will be below described in detail by reference to FIG. 1A, FIG. 1B and FIG. 2.

The electrode 11 and given circuit patterns (not shown) are formed on the substrate 10. A printed circuit board (PCB) made of a material the impedance matching, crosstalk and skew of which are sufficiently low, that is FR-4, ceramic, etc.

is used as the substrate 10. The PCB ground electrode 12 is formed on the PCB and grounds the electrical signal.

The driving unit/receiving unit 20 and the light source/photodetector 30 are formed on the substrate 10 in an array shape. The driving unit/receiving unit 20 is bonded on the PCB ground electrode 12 by means of soldering using a solder 21. The light source/photodetector 30 is bonded on the bottom of the trench 52 formed within the silicon optical bench 50 by means of soldering using a solder 31. The driving unit/receiving unit 20 is connected to the electrode pad 11 by the bonding wire 22. The light source/photodetector 30 is connected to the driving unit/receiving unit 20 by means of the bonding wire 32. Also, the light source/photodetector 30 include a photo diode (PD) used as an optical receiving device, and the VCSEL used as the light source and also has an aperture 34 through which light from the light source is emitted toward the outside or the light from the outside is incident to the optical receiving device. In other words, the light source 30 serves to generate an optical signal to output it to the outside through the aperture 34. The photodetector 30 serves to convert the optical signal incident via the aperture 34 from the outside into an electrical signal. The driving unit/receiving unit 20 serves to drive the light source 30 depending on the electrical signal supplied through the electrode pad 11 or to amplify the electrical signal from the photodetector 30 to output the electrical signal via the electrode pad 11.

A heat spreader 13 being a part of the substrate 10 functions to emit heat generated in the driving unit/receiving unit 20 and the light source/photodetector 30. The silicon optical bench ground electrode 33 is formed on the silicon optical bench 50 and is connected to a ground electrode pad (not shown) of the light source/photodetector 30. The silicon optical bench ground electrode 33 serves to wire-bond the ground electrode pad and a neighboring PCB ground electrode 12. The light source/photodetector 30 is mounted within the trench 52 of the silicon optical bench 50 and the silicon optical bench 50 is attached on the heat spreader 13 by means of an adhesive 51 having a high thermal conductivity. The optical waveguide 40 and the light source/photodetector 30 are attached in line with a waveguide alignment mark 47 within the optical waveguide 40 and a silicon optical bench alignment mark 53 on the surface of the silicon optical bench 50.

Figure 3A:
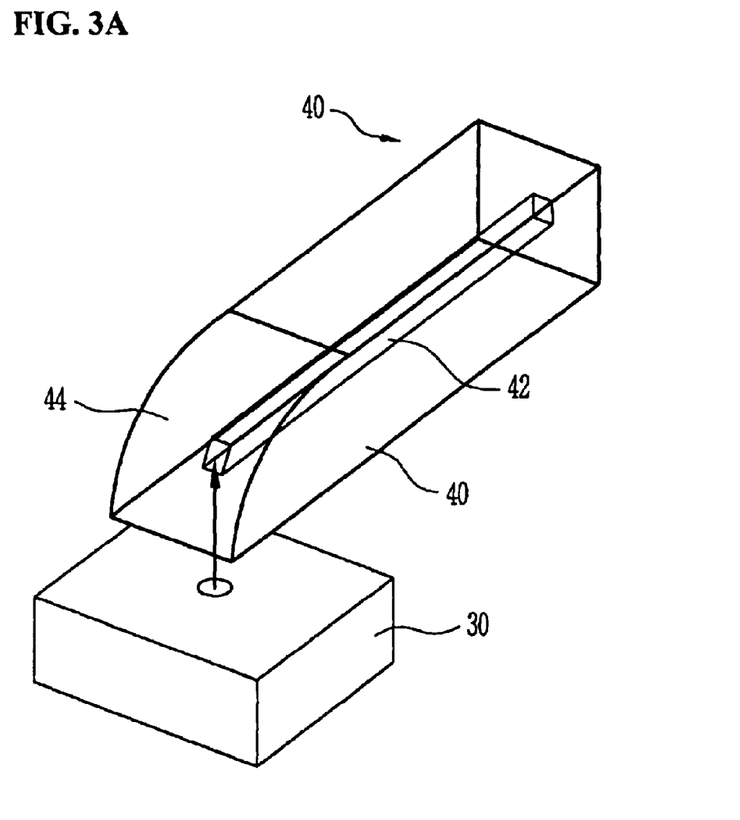
FIG. 3A and FIG. 3B illustrate a structure of an optical waveguide having a reflection curvature and a graph of design parameters.
Figure 3B:
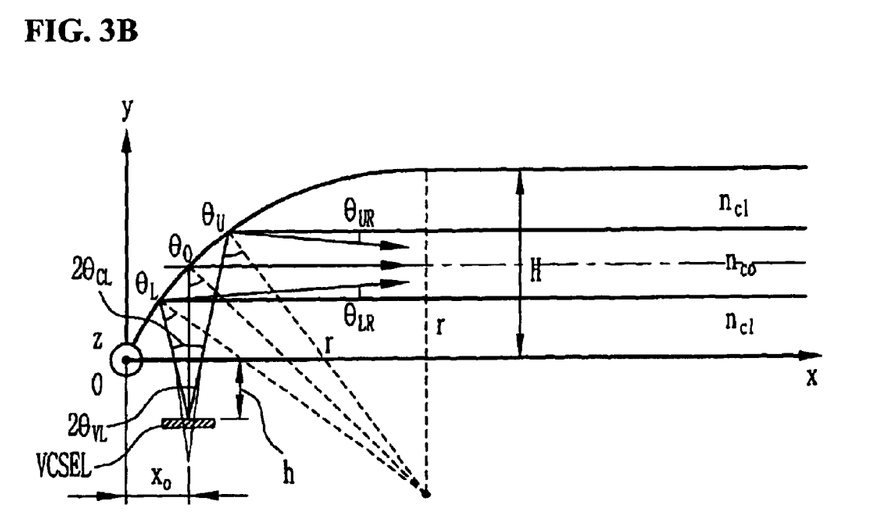
Figure 4A:
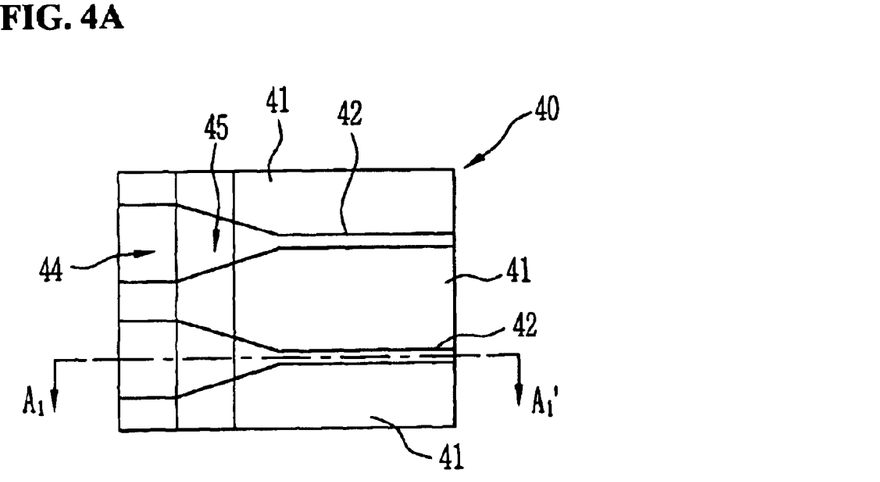
FIG. 4A and FIG. 4B plan and cross-sectional views of another optical waveguide.
Figure 4B:
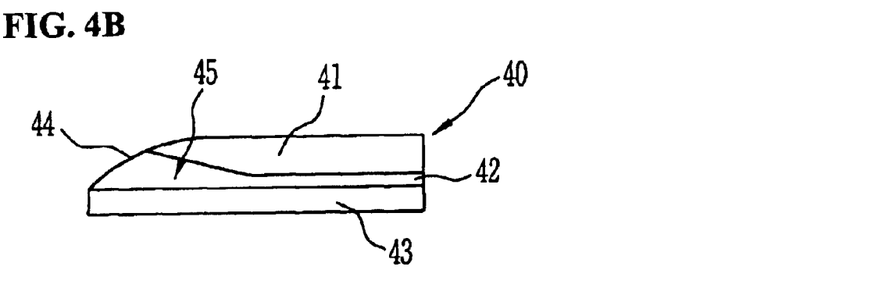

FIG. 3A and FIG. 3B illustrate a structure of an optical waveguide having a reflection curvature and a graph of design parameters, and FIG. 4A and FIG. 4B are plan and cross-sectional views of another optical waveguide, wherein FIG. 4B is a cross-sectional view of the optical waveguide taken along lines A1–A1' in FIG. 4A.

Referring now to FIG. 3A, FIG. 4A and FIG. 4B, the optical waveguide 40 of the present invention has a structure in which a core 42 is formed between a lower clad layer 43 and an upper clad layer 41. The core 42 may have an uniform shape as in FIG. 3A, and a shape having a taper element 45 which is increasingly widen than other portions as shown in FIG. 4A and FIG. 4B. Also, as in FIG. 4A and FIG. 4B, an edge of the reflection surface 44 is chamfered so that can be prevented from contact with a bonding wire of the VCSEL 30 array chip. The reflection surface 44 made of a curvature having a given curvature radius is formed at the end of the core 42 based on design parameters in FIG. 3b. In other words, the core 42 is made of materials such as polymer (PMMA; polymethyl methacrylate) or epoxy series through which light having a given range of wavelength can be transmitted. If an end of this material is rounded to have a given curvature radius, the reflection surface 44 the reflectivity of which at the machined surface focused to the core 42 is increased is formed. The lower and upper clad layers 43 and 41 are made of polymer (PMMA) or UV epoxy series materials. The refractive index and size of the lower and upper clad layers 43 and 41 and the core 42 are selected to have the maximum optical coupling efficiency considering the specifications of an optical fiber to be connected.

Assuming that the intensity of light that is emitted from the light source 30, that is the VCSEL laser 30 is a Gaussian distribution, and the VCSEL light has a ray as much as the radiation angle ($\theta_{VL}$) and passes the clad region of the optical waveguide 40 to reach the reflection surface 44. At this time, a Snell's law is applied to determine the reflection angle and refractive angle. Further, the reflection angle is applied to the reflection rate by means of Fresnel reflection formula. Considering the size and critical angle of the core 42 against the optical waveguide 40, rays that are totally reflected and waveguide within the optical waveguide 40 are all integrated to determine the optical coupling efficiency. An explanation for this will be further described in detail by reference to FIG. 3B.

FIG. 3B is a graph for defining design parameters for optimally designing the structure shown in FIG. 3A.

Referring again to FIG. 3B, an edge portion of the optical waveguide 40 forms a function structure of a curvature wherein the function is one contacting the top surface of the optical waveguide 40. At this time, the thickness of the optical waveguide 40 is H, the refractive index of the core 42 is $n_{co}$, and the refractive index of the clad layers 41 and 43 are $n_{cl}$. An edge of the optical waveguide 40 has a curved surface the radius of which is r. The function of this circle starts from the surface on the optical waveguide 40. The light source/photodetector 30 is spaced from the bottom of the lower clad layer 43 of the optical waveguide by h. At this time, $x_0$ indicates the central location of the aperture (see '34' in FIG. 1A) in the light source/photodetector 30 in an x-axis direction and $z_0$ indicates the central location of the aperture 34 in the light source/photodetector 30 in a z-axis direction.

In FIG. 3B, the light beam emitted from the light source 30, which is the VCSEL laser 30 is propagated in a free space while it is propagated by an radiant angle ($\theta_{VL}$) of the laser 30. If the light beam reaches to the bottom of the lower clad layer 43, the radiant angle ($\theta_{VL}$) is changed to $\theta_{CL}$ in the lower clad region according to Snell's law. If the beam meets the reflection surface 44 of a curved surface, it is distributed into the lowest reflection angle $\theta_L$ and refractive angle (not shown), the center angle $\theta_O$ and refractive angle (no shown), and the top reflection angle $\theta_U$ and the refractive angle (not shown) depending on a TE polarizing mode and a TM polarizing mode according to Fresnel reflection formula.

The light emitted from the VCSEL laser 30 first experiences a reflection loss by Fresnel loss (not considered) in the lower clad layer 43 and then propagates within the core 42 by the Fresnel reflectivity depending on the polarizing mode in the reflection surface 44. At this time, only light among the light that is incident to the core 42 but does not exceed the critical angle of the optical waveguide 40 is propagated without loss.

Figure 5A:
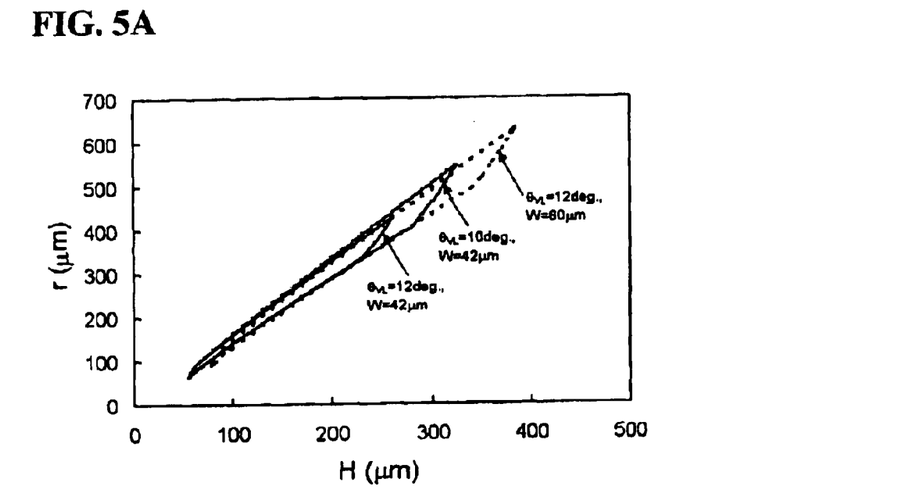
FIG. 5A and FIG. 6B are graphs illustrating the thickness of the optical waveguide and the range of the radius of curvature depending on the height of a vertical cavity surface emitting laser (VCSEL)
Figure 5B:
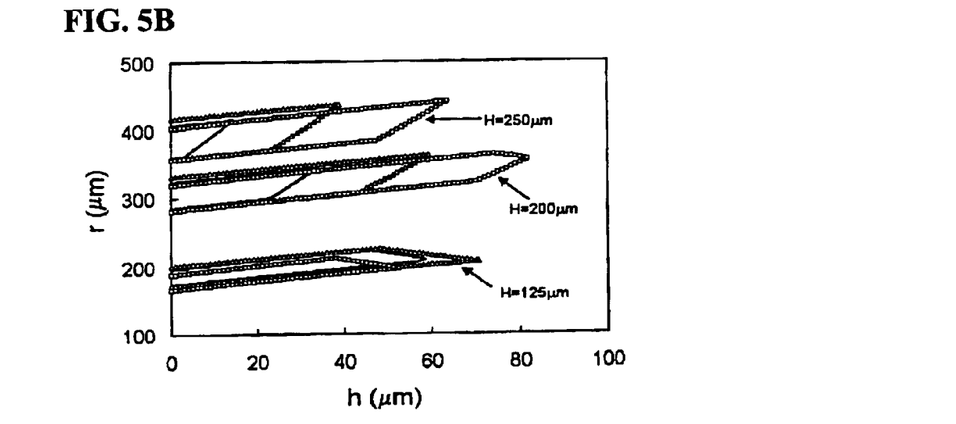

FIG. 5A and FIG. 5B are graphs illustrating the thickness of the optical waveguide and the range of the radius of curvature depending on the height of a vertical cavity surface emitting laser (VCSEL).

Referring now to FIG. 5A and FIG. 5B, the design condition includes $n_{co}$=1.50788, $n_{cl}$=1.49, h=10 μm, Δ z=0

μm, and Δx is an optical location value (different depending on respective design parameters). In particular, FIG. 5A shows a closed graph of the curvature radius the optical coupling efficiency of which is almost 100% in the reflection surface 4 of the curved surface depending on the height (h) of a VCSEL 30 when the radiant angle ($\theta_{VL}$) of the VCSEL laser 30, the size (W) of the core 42 and the thickness (H) of the optical waveguide 40 are used as parameters.

Figure 6A:
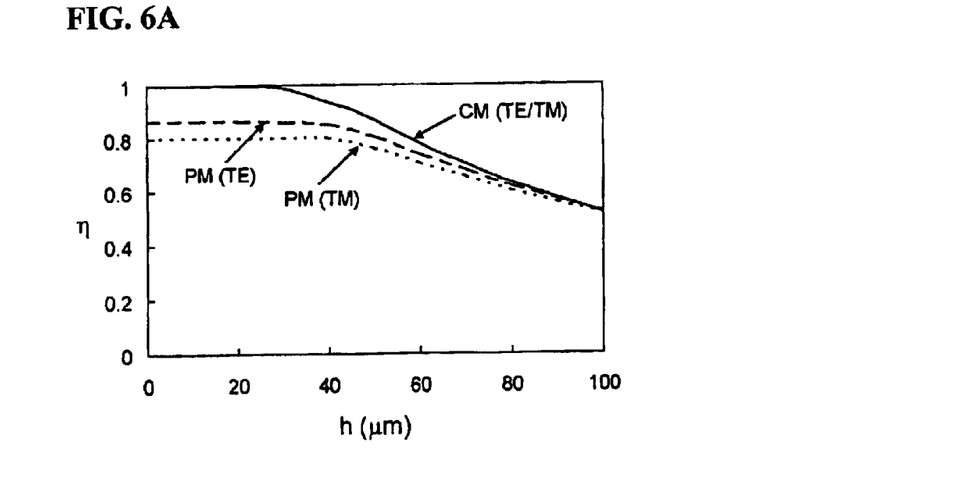
Figure 6B:
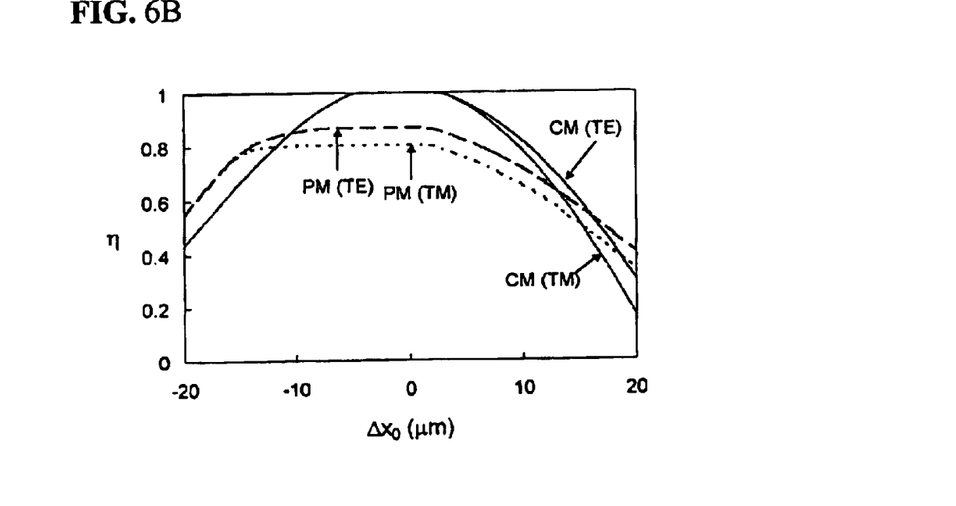
Figure 6C:
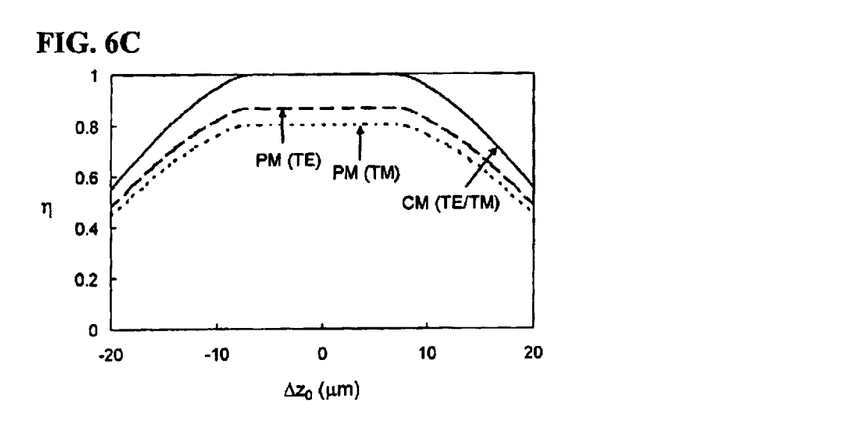

FIG. 6A~FIG. 6C are graphs illustrating a result of comparing the optical coupling efficiency of an optical waveguide of a reflection curvature and an optical waveguide of a 45 reflection plane.

Referring now to FIG. 6A~FIG. 6C, the design conditions include $\theta_{VL}=12°$, $n_{co}=1.50788$, $n_{cl}=1.49$, W=42 μm, H=200 μm, r=320 μm and h=10 μm. FIG. 6A shows a result of simulating the optical coupling efficiency (η) depending on the height (h) of the VCSEL against a curved mirror (CM) and plane mirror (PM) for the TE and TM polarizing modes using a Ray Tracing method. From the drawings, it could be seen that the curved mirror (CM) has a significant optical coupling efficiency (η) even at the height (h) of any VCSEL. FIG. 6B and FIG. 6C are results of simulating the optical coupling efficiency (η) using a Ray Tracing method depending on variations in the central location of the VCSEL in an x-axis direction (longitudinal direction) and a z-axis direction (horizontal direction) for the curved mirror (CM) and the plane mirror (PM) against the TE and TM polarizing modes. From the drawings, it could be also seen that the curved mirror (CM) has a significant optical coupling efficiency (η).

Figure 7A:
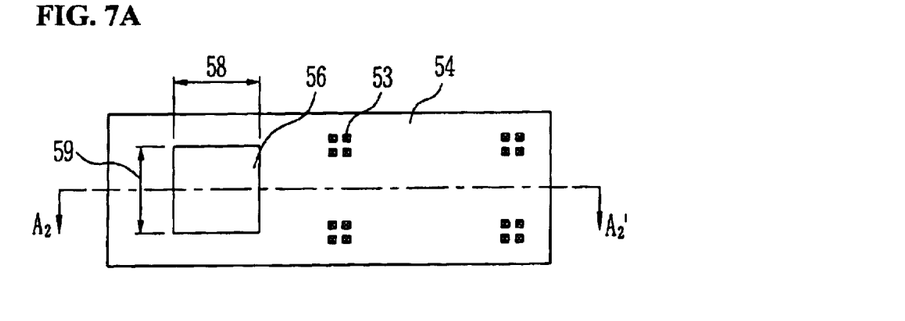
FIGS. 7A, 7B, and 7C are plan and cross-sectional views for explaining manual alignment and adhesion of the vertical cavity surface emitting laser and a photo diode array chip.
Figure 7B:
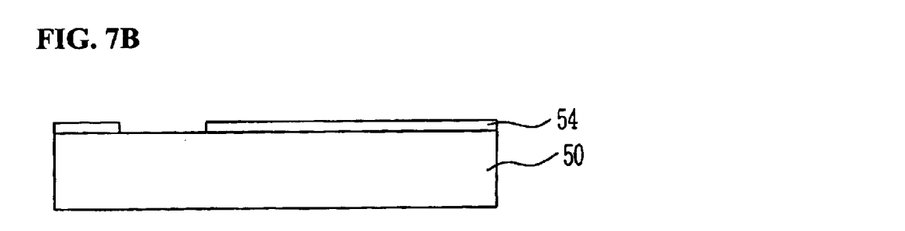
Figure 7C:
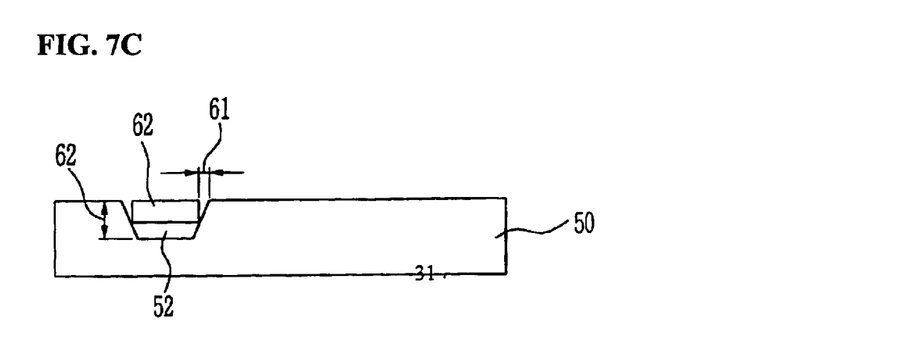

FIG. 7A~FIG. 7C are plan and cross-sectional views for explaining manual alignment and adhesion of the vertical cavity surface emitting laser and a photo diode array chip. FIG. 7B is a cross-sectional view of the vertical cavity surface emitting laser and the photo diode array chip taken along lines A2–A2' in FIG. 7A.

FIG. 7A and FIG. 7B illustrate a silicon nitride film 54 patterned on a silicon optical bench 50 to form the silicon optical bench 50 and FIG. 7C illustrates the VCSEL 30 chip is mounted within a trench 52 formed in the silicon optical bench 50. The design values of the horizontal width 58 and the vertical width 59 of the etching window 56 is approximately adjusted before the trench 52 so that the VCSEL 30 chip can be located in a horizontal direction. The trench marginal width 61 and the trench depth 62 are formed so that the VCSEL 30 can be located at a desired location in a depth direction. Therefore, the VCSEL 30 chip is self-aligned in a horizontal direction and depth direction, so that there is no additional alignment.

Figure 8:
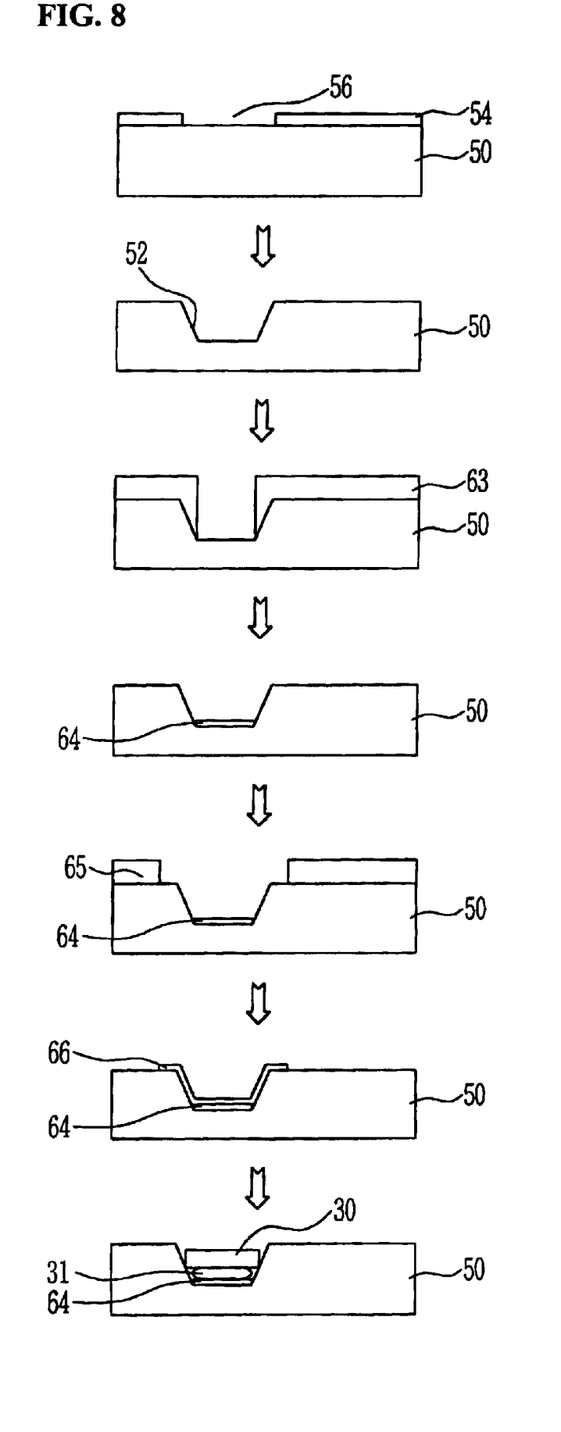
FIG. 8 is a cross-sectional of an optical bench FIG. 7C for explaining a process of manufacturing the optical bench.

FIG. 8 is a cross-sectional of an optical bench FIG. 7C for explaining a process of manufacturing the optical bench.

Referring now to FIG. 8, a silicon nitride film is deposited on the silicon optical bench 50 by means of a LPCVD method. The silicon nitride film is then patterned using a photoresist. The silicon nitride film is patterned (54) by means of reactive ion etching (RIE) to form an etching window 56. Thereafter, the silicon optical bench 50 is wet-etched using calcium hydroxide (KOH) to form the trench 52. The silicon nitride film 54 is then removed using phosphoric acid or BOE (buffered oxide etch). Then, an ultra-thick photoresist such as AZ9260, AZ4903, etc. is applied to form a photoresist pattern 63. Next, Ti/Ni/Au being a base metal 64 are sequentially deposited using the E-beam depositing apparatus. The photoresist pattern 63 is removed. Next, a rapid thermal annealing is performed. After an ultra-thick photoresist pattern 65 for a solder is formed, material 66 for the solder such as AuSn is deposited by means of the E-beam depositing apparatus. After the ultra-thick photoresist pattern 65 for the solder is removed, the material for the solder 66 is reflowed by heat. Next, the light source/photodetector 30 chip is inserted into the trench 52 of the silicon optical bench 50. If the silicon optical bench 50 is applied with heat while the light source/photodetector 30 chip is applied with some pressure, the light source/photodetector 30 is bonded to the solder 31 at the bottom of the trench 52 of the silicon optical bench 50 while the light source/photodetector 30 chip is self-aligned.

Figure 9A:
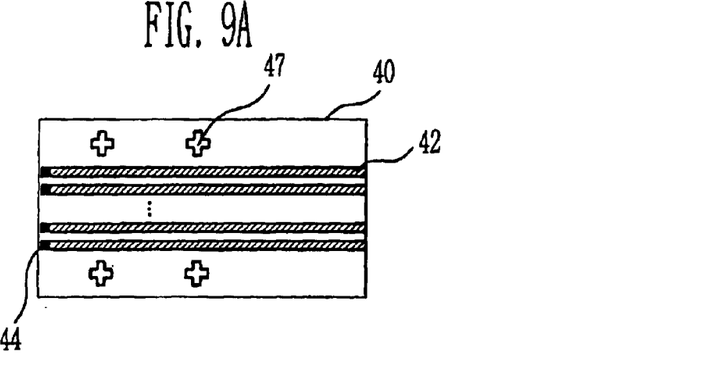
FIGS. 9A, 9B and 9C are plan views for explaining a manual alignment of a silicon optical bench and an optical waveguide.
Figure 9B:
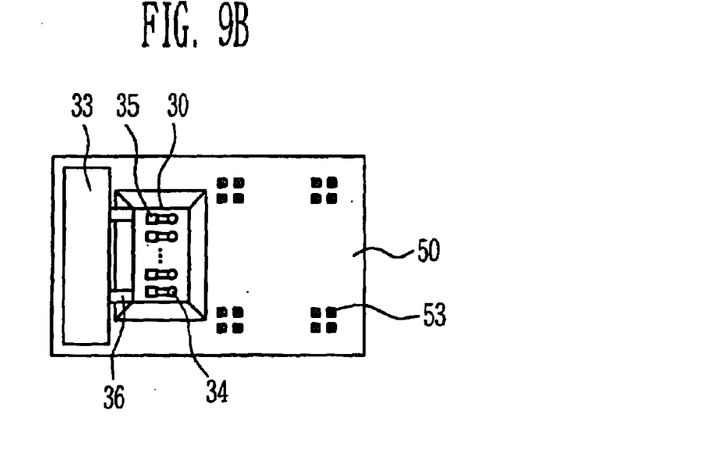
Figure 9C:
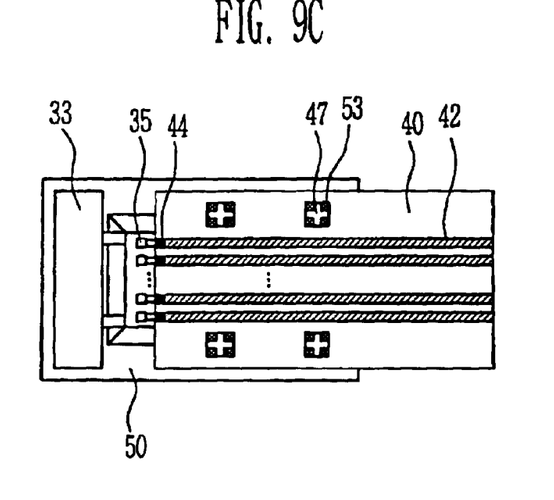

FIG. 9A–FIG. 9C are plan views for explaining alignment and adhesion between the light source and the photodetector mounted within the optical waveguide and the silicon optical bench.

FIG. 9A–FIG. 9C are plan views for explaining a manual alignment of the silicon optical bench and the optical waveguide, which shows a case that the VCSEL or the photodiode (PD) array chip is self-aligned to the optical waveguide having a reflection mirror of curved or plan surface.

FIG. 9A and FIG. 9B show before-alignment and adhesion. If the alignment and adhesion are performed using the alignment mark 47 of the optical waveguide 40 and the alignment mark 53 of the silicon optical bench 50, alignment between the reflection surface 44 formed at the optical waveguide 40, for example the curved or plan reflection mirror, and the aperture 34 of the light source/photodetector 30 within the trench 52 of the silicon optical bench 50 is made as in FIG. 9C. The electrical signal of the light source/photodetector 30 in FIG. 9A–9C, is supplied to the electrode pad 33 on the surface of the silicon optical bench 50 connected to the wire 36 of an anode electrode pad 35 and a cathode electrode pad (the bottom of the light source/photodetector, not shown).

Figure 10A:
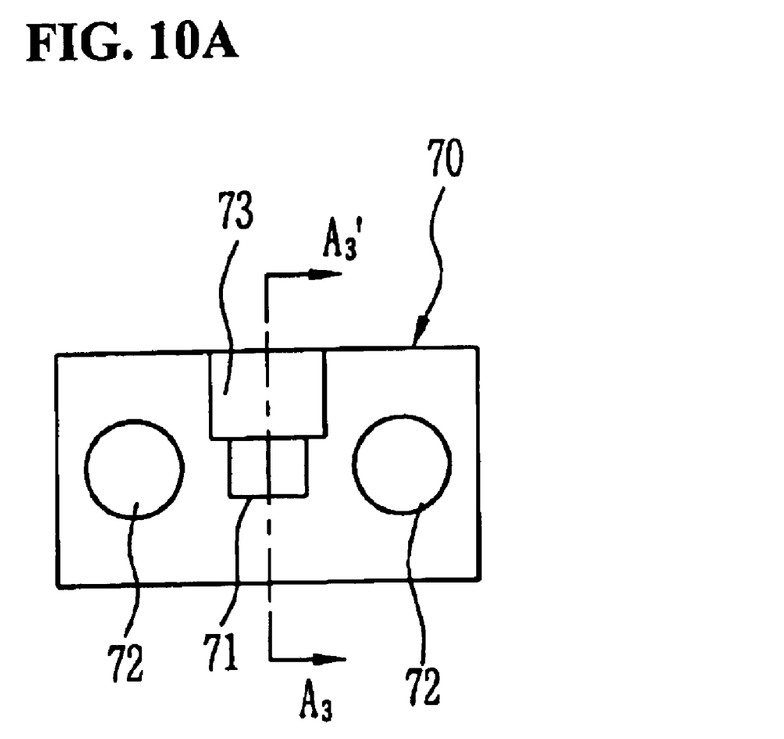
FIG. 10A and FIG. 10B are front and cross-sectional views of a ferrule shown in FIG. 1A and FIG. 1B.
Figure 10B:
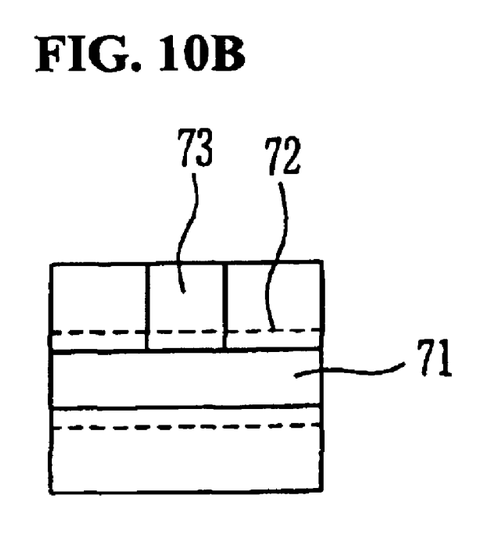

FIG. 10A and FIG. 10B are front and cross-sectional views of the ferrule shown in FIG. 1A and FIG. 1B. FIG. 10B is a cross-sectional view of the ferrule taken along lines A3–A3' in FIG. 10A.

Referring now to FIG. 10A and FIG. 10A, the ferrule 70 of the present invention has a waveguide hole 71 I into which the optical waveguide 40 is inserted, that is formed at the center of the ferrule 70, and a guide hole 72 into which the guide pin (not shown) for interconnection with the adaptor 80 is inserted, that is formed at both sides of the waveguide hole 71, as shown in FIG. 10A. The guide hole 72 is a hole into which the guide pin used for interconnection with multi-channel optical connectors is inserted, which is made in line with International Electrotechnical Commission (hereafter called 'IEC') standard.

Further, a fixing hole 73 connected to the waveguide hole 71 is formed on the waveguide hole 71, as shown in FIG. 10B. The optical waveguide 40 is completely fixed to the ferrule 70 by inserting the optical waveguide into the waveguide hole 71, burying an adhesive (epoxy series material) into the fixed hole 73 and hardening the adhesive using heat, ultraviolet (UV), etc.

The ferrule 70 is made of a material that can accomplish stability in the temperature and fine shaping, for example a material in which silica and polymer are mixed, by means of a transfer molding method. An external dimension of the ferrule 70 is compatible with the IEC international standard and an internal dimension of which has a size into which the optical waveguide 40 can be inserted.

The substrate 10 and the adaptor 80 constructed thus, is interconnected at a right angle so that the aperture 34 of the light source/photodetector 30 and the reflection surface 44 of the optical waveguide 40 are opposite, as shown in FIG. 2.

A process of optical connection using the parallel optical interconnect transmit/receive module constructed thus will be described by reference to FIG. 1A and FIG. 1B.

In case of the optical transmit module, the driving unit 20 drives the light source 30 depending on the electrical signal supplied through the electrode pad 11. The optical signal generated as the light source 30 is driven is reflected from the reflection surface 44 of the optical waveguide 40 through the aperture 34, so that the path of the optical signal is changed by 90°. The optical signal the path of which is changed is then transmitted to the optical fiber connecter to the adaptor 80 along the core 42. At this time, the light reflected from the reflection surface 44 is focused at a given distance. The focused light passes the core 42.

In case of the optical receive module, the optical signal transmitted through the optical fiber is reflected from the reflection surface 44 through the core 42 of the optical waveguide 40, so that the path of the optical signal is changed. Next, the optical signal the path of which is changed is incident to the photodetector 30 through the aperture 34. The photodetector 30 converts the incident optical signal into an electrical signal. The receiving unit 20 amplifies the electrical signal supplied from the photodetector 30 and then outputs the amplified signal through the electrode pad 11. The light reflected from the reflection surface 44 is focused at a given distance. The focused light is incident to the photodetector 30 through the aperture 34.

In the above explanation, it is described that one layer exists on another layer. However, it should be noted that the one layer may exist immediately on the another layer and a third layer may be intervened between the two layers.

As mentioned above, according to the present invention, a reflection surface of a curved surface is formed at an end of a core forming an optical waveguide so that the path of the optical signal is exactly changed and is focused. Therefore, the present invention can minimize the coupling loss in the process during which the optical signal is transmitted, thus increasing the optical output.

Further, the silicon optical bench (SiOB) is automatically self-aligned while the VCSEL and the photodiode (PD) array chip are buried within the trench of the silicon optical bench. As the interconnection between the VCSEL/photodiode (PD) and the optical waveguide can be manually exactly aligned, the productivity can be improved.

Also, the optical waveguide is inserted into the ferrule and the ferrule is fixed to the adaptor so that the optical waveguide and the light source/photodetector can be easily and exactly aligned and the optical waveguide and the adaptor can be easily and exactly fixed. Thus, the alignment error between the optical waveguide and the light source/photodetector is widen, so that they can be manually and automatically aligned. Further, the productivity can be improved and optical interconnection can be made with low cost.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A parallel optical interconnection module, comprising:
   a substrate having a heat spreader thereon and in which an electrode pad and given electronic circuit patterns are formed;
   a silicon optical bench formed on the substrate and having a trench;
   a light source/photodetector formed within the trench of the silicon optical bench and having a light source and a photodetector, wherein said light source generates an optical signal to output the signal toward the outside through an aperture and said photodetector receives the optical signal incident through the aperture from the outside and then converts the optical signal into an electrical signal;
   a driving unit/receiving unit formed on the substrate and having a driver and a receiver, wherein said drive drives the light source depending on the electrical signal supplied through the electrode pad and said receiver amplifies the electrical signal from the photodetector to output the amplified signal to the electrode pad;
   an optical waveguide having a core formed between lower and upper clad layers and having a reflection surface formed at the end of the core;
   an adaptor connected to a connector connected to an optical fiber; and
   a ferrule for fixing the optical waveguide to the adaptor,
   wherein said substrate and said adaptor are coupled so that the aperture and the reflection surface are opposite.

2. The parallel optical interconnection module as claimed in claim 1, wherein said light source includes a vertical cavity surface emitting laser array.

3. The parallel optical interconnection module as claimed in claim 1, wherein said photodetector includes a photodiode array.

4. The parallel optical interconnection module as claimed in claim 1, wherein the reflection surface at one side of the optical waveguide is formed to be curved.

5. The parallel optical interconnection module as claimed in claim 1, wherein portions at the end of the reflection surface of a curved surface of the optical waveguide or the reflection of a plan surface is chamfered.

6. The parallel optical interconnection module as claimed in claim 1, wherein said lower and upper clad layers are made of either polymer or epoxy.

7. The parallel optical interconnection module as claimed in claim 1, wherein said core is made of either polymer or epoxy.

8. The parallel optical interconnection module as claimed in claim 1, wherein said core has one of a uniform shape and a taper shape, one side of which is wider than a second side.

9. The parallel optical interconnection module as claimed in claim 1, wherein a waveguide hole into which the optical waveguide is inserted, that is formed at the center of the ferrule, a guide hole into which a guide pin for interconnection with the adaptor, that is formed at both sides of the waveguide hole, and a fixing hole for fixing the optical waveguide, that is formed on the waveguide hole.

10. The parallel optical interconnection module as claimed in claim 9, wherein epoxy for fixing the optical waveguide is buried in the fixing hole.

11. The parallel optical interconnection module as claimed in claim 9, wherein said ferrule is made of a mixture of silica and polymer.

12. A method of manufacturing a parallel optical interconnection module, comprising the steps:

preparing an optical waveguide in which a core is formed between lower and upper clad layers and having a reflection surface at the end of the core;

forming a silicon nitride film pattern for defining a trench on said silicon optical bench;

etching the silicon optical bench using the silicon nitride film pattern as an etch mask to form a trench, wherein the trench is formed by controlling the marginal width and depth of the trench so that the light source/photodetector can be located at a desired location within the trench in a depth direction;

removing the silicon nitride film pattern;

depositing a base metal layer within the trench and performing annealing;

depositing a material for a solder within the trench and then heating the material to reflow the material;

inserting/mounting a light source/photodetector so that the light source/photodetector can be self-aligned in horizontal and depth directions within the trench; and exactly aligning an alignment mask formed on the upper clad layer and an alignment mask formed on the silicon optical bench so that the reflection surface and the aperture formed at the light source/photodetector are opposite in order to attach the optical waveguide on the silicon optical bench.

* * * * *